(12) United States Patent  (10) Patent No.: US 7,764,797 B2
Yamamoto et al.  (45) Date of Patent: Jul. 27, 2010

(54) SPEAKER DRIVING DEVICE AND AUDIO OUTPUT SYSTEM

(75) Inventors: Makoto Yamamoto, Mishima-gun (JP); Keiichi Fujii, Kusatsu (JP)

(73) Assignee: Panasonic Corporation, Osaka (JP)

( * ) Notice: Subject to any disclaimer, the term of this patent is extended or adjusted under 35 U.S.C. 154(b) by 1142 days.

(21) Appl. No.: 11/255,986

(22) Filed: Oct. 24, 2005

(65) Prior Publication Data

US 2006/0093153 A1 May 4, 2006

(30) Foreign Application Priority Data

Oct. 28, 2004 (JP) .............................. 2004-313181

(51) Int. Cl.
*H04R 29/00* (2006.01)
(52) U.S. Cl. ........................... 381/59; 381/58; 381/120; 381/123
(58) Field of Classification Search ................... 381/77, 381/81, 85, 120, 123, 58–59, 55; 700/94
See application file for complete search history.

(56) References Cited

U.S. PATENT DOCUMENTS 5,910,991 A * 6/1999 Farrar ........................... 381/59
2002/0102003 A1* 8/2002 Ford ............................ 381/120
2006/0159292 A1* 7/2006 Guilbert ..................... 381/120

FOREIGN PATENT DOCUMENTS

| JP | 58-191713 | 12/1983 |
| JP | 61-065699 | 4/1986 |
| JP | 61-251214 | 11/1986 |
| JP | 03-222508 | 10/1991 |
| JP | 07-240636 | 9/1995 |
| JP | 63217806 A | 9/1999 |
| JP | 2001-185960 | 7/2001 |
| JP | 2003-032777 | 1/2003 |

* cited by examiner

*Primary Examiner*—Xu Mei
*Assistant Examiner*—Disler Paul
(74) *Attorney, Agent, or Firm*—Steptoe & Johnson LLP (57) ABSTRACT

The present invention detects whether the supply voltage applied to the power supply terminal (3) is used for the dynamic speaker or for the piezoelectric speaker by the power supply voltage detection circuit (10), switches the gain of the amplifier circuit (8) in accordance with the detection result by the gain switching circuit (11) so that the same output power is produced for the same input signal in the respective speaker driving, and amplifies the input signal from the input terminal (5) by the amplifier circuit (8) having the gain to drive a speaker (1) that is connected to the output terminals (6, 7).

4 Claims, 6 Drawing Sheets

SPEAKER DRIVING DEVICE AND AUDIO OUTPUT SYSTEM

BACKGROUND OF THE INVENTION

1. Field of the Invention

The present invention relates to a speaker driving device and audio output system that drive a speaker mounted in a portable device such as a cellular phone, for example, by means of an output signal obtained by amplifying an input signal.

2. Description of the Related Art

Conventionally, in the case of a device in which a speaker is mounted, i.e. a portable device such as a digital video camera (DVC), digital still camera (DSC), cellular phone, or notebook personal computer, for example, when a speaker driving device that drives the speaker takes the form of an IC and constitutes an audio output system together with the speaker, there is a multiplicity of cases where a piezoelectric speaker is used with the objective of a small footprint as the mounted speaker.

A conventional speaker driving device for driving such a piezoelectric speaker and an audio output system will be described hereinbelow taking the example of the speaker driving device and audio output system that appear in Japanese Patent Application Laid Open No. S63-217806.

Figure 5:
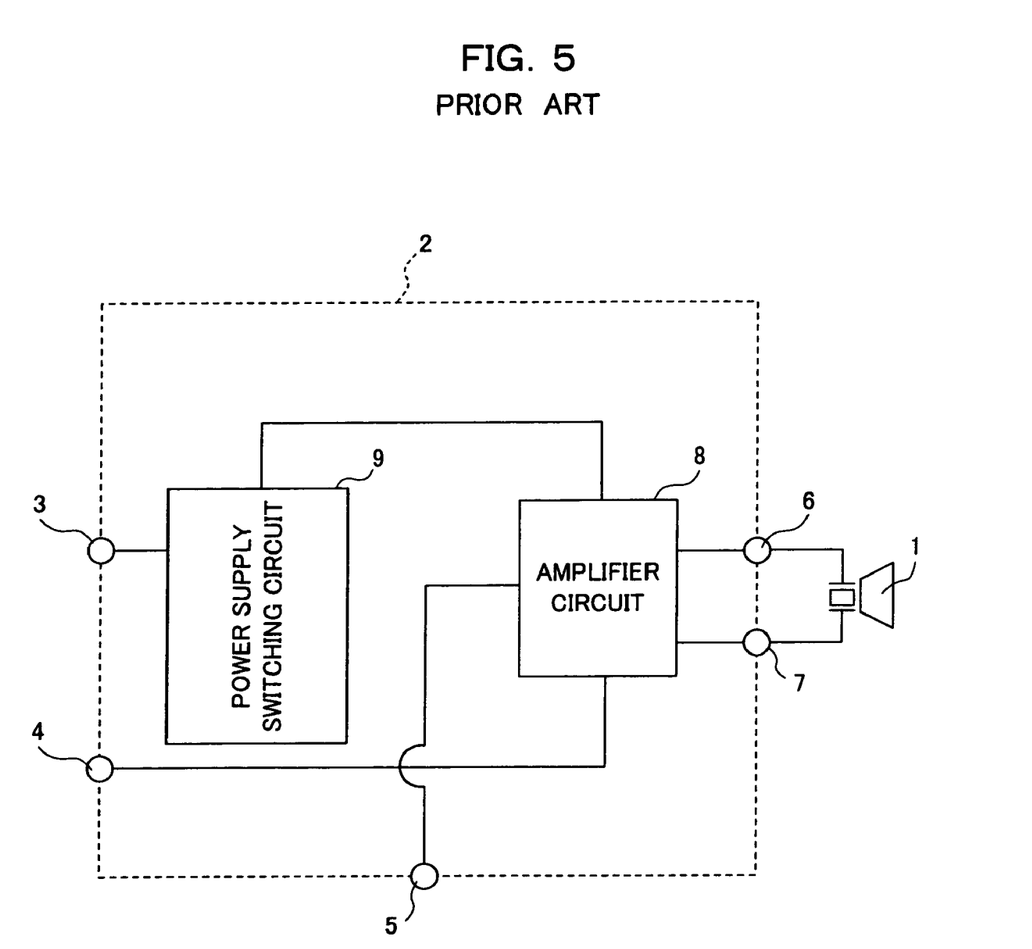
FIG. 5 is a block diagram showing a constitutional example of a conventional speaker driving device and audio output system.

FIG. 5 is a block diagram showing the constitution of an audio output system that drives a piezoelectric speaker by means of a conventional speaker driving device. In a speaker driving device 2 shown in FIG. 5, an amplifier circuit 8 that is capable of driving a piezoelectric speaker constituting a speaker 1 which is connected to output terminals 6 and 7 by means of a high dynamic range in order to obtain an adequate acoustic pressure level by amplifying an input signal from input terminal 5, and a power supply switching circuit 9 for generating a high voltage power supply that is required for the output stage of the amplifier circuit 8 by increasing the voltage from an external low voltage power supply are incorporated on the same chip. As a result, miniaturization of the device and ease of mounting were surveyed.

However, in a conventional speaker driving device and audio output system as described above, because the output power from the amplifier circuit 8 is inversely proportional to the load impedance of speaker 1, the piezoelectric speaker can be suitably driven without design problems. However, assuming a case where a dynamic speaker that is generally widely used to stabilize costs, for example, is used with this circuit constitution as is, a speaker with a lower load impedance than that of a piezoelectric speaker is driven, in the case of such speaker driving, the output power from the amplifier circuit 8 is large in comparison with a case where a piezoelectric speaker is driven, which results in the problem that the acoustic pressure from the speaker is excessive.

That is, the conventional speaker driving device and audio output system shown in FIG. 5 are unable to adapt without operational distinction to both driving types of the piezoelectric speaker and dynamic speaker with a different load impedance as driven speaker 1 by means of the same constitution and are unable to output a signal of the same power for the same input signal in the respective speaker driving.

Figure 6A:
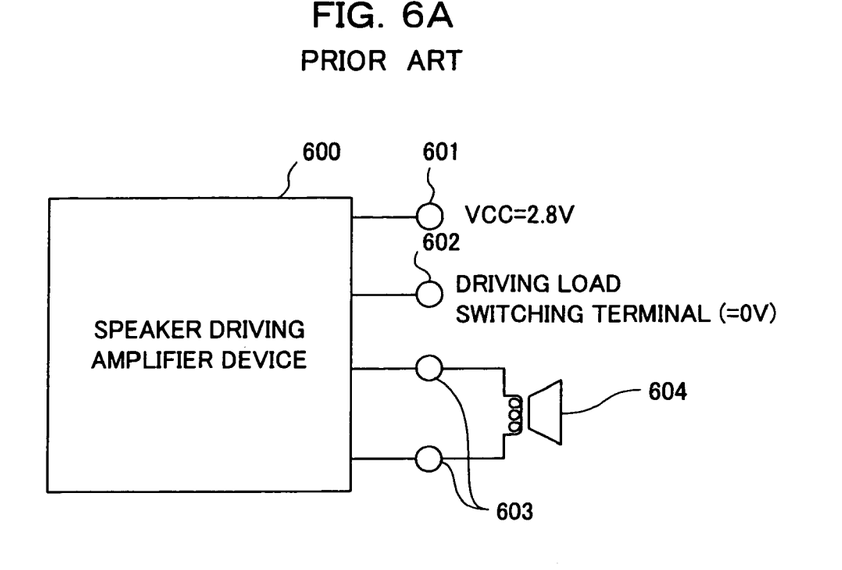
FIG. 6A is a block diagram showing a constitutional example of another conventional speaker driving device and audio output system.
Figure 6B:
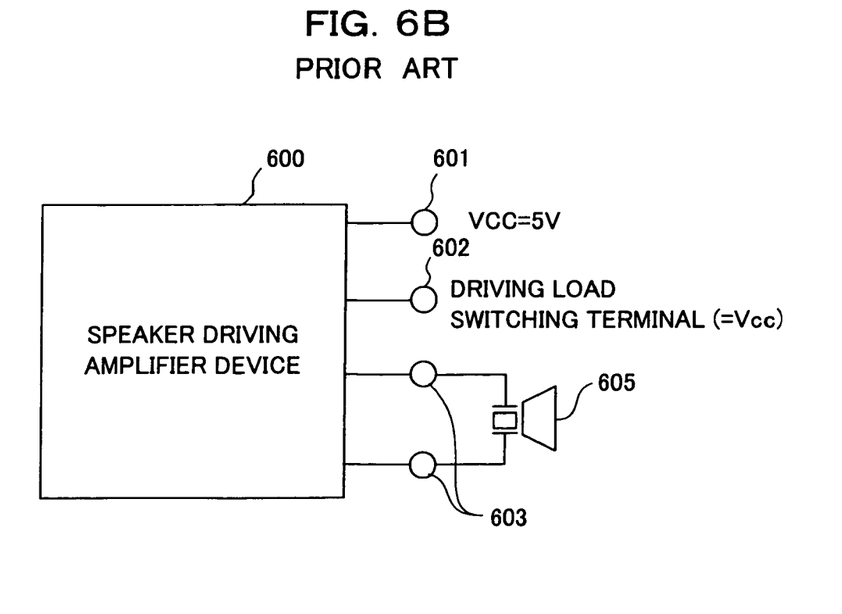
FIG. 6B is a block diagram showing a constitutional example of another conventional speaker driving device and audio output system.

In view of this problem, as a constitution for outputting a signal of the same power for the same input signal by considering the fact that the load impedance is different for the dynamic speaker and piezoelectric speaker, for example, in the driven speaker, the constitution of an audio output system comprising a speaker driving device shown in FIG. 6A or FIG. 6B may be considered.

Audio output systems comprising a speaker driving device shown in FIG. 6A and FIG. 6B will be described hereinbelow. FIG. 6A and FIG. 6B each is a block diagram showing another constitutional example of an audio output system comprising a conventional speaker driving device. In the audio output systems shown in FIG. 6A and FIG. 6B, 600 is a speaker driving device having a plurality of amplifier circuits of different amplification gains corresponding with the types of driving load; 601 is a power supply terminal for applying power (VCC) that supplies the power consumed during signal amplification to the speaker driving device 600; 602 is a driving load switching terminal for applying a switching signal for selectively switching the type of amplifier circuit that acts in the speaker driving device 600 in accordance with the type of driving load; 603 is an output terminal that outputs supplied power that is supplied to the driving load; 604 is a dynamic speaker, which is one of the driving loads; and 605 is a piezoelectric speaker, which is another one of the driving loads.

The operation of the audio output system comprising the speaker driving device constituted as described above will be described next.

As mentioned earlier, the speaker driving device 600 shown in FIG. 6A and FIG. 6B comprises built-in amplifier circuits (not shown) of two types with different amplification gains so that the output power to each of the loads 604 and 605 are equal for the same input signal level corresponding to the type (local impedance) of the connected loads 604 and 605 and the amplifier circuits of two types are switched according to the types of the loads 604 and 605 by means of the switching control signal high (VCC) or low (0V) applied from the outside to the driving load switching terminal 602.

For example, as shown in FIG. 6A, the constitution is such that, when the dynamic speaker 604 having a low load impedance is connected as the load to the output terminal 603 of the speaker driving device 600, by applying a power supply of VCC=2.8V as the power supply to the speaker driving device 600 to the power supply terminal 601 and making the potential of the switching control signal applied from the outside to the driving load switching terminal 602 a low potential (0V), selective switching is controlled such that the amplifier circuit with an amplification gain for driving the dynamic speaker 604 operates as a connected load among the two types of amplifier circuit in the speaker driving device 600.

On the other hand, as shown in FIG. 6B, the constitution is such that, when the piezoelectric speaker 605, which has a higher load impedance than the dynamic speaker 604, is connected as the load to the output terminal 603 of the speaker driving device 600, by applying a power supply of VCC=5V as the power supply to the speaker driving device 600 to the power supply terminal 601 and making the potential of the switching control signal applied from the outside to the driving load switching terminal 602 a high potential (VCC), selective switching is controlled such that the amplifier circuit with an amplification gain for driving the piezoelectric speaker 605 operates as a connected load among the two types of amplifier circuit in the speaker driving device 600.

By controlling the selective switching in this manner, the output power to each load is equal for the same input signal level, irrespective of the type of connected load.

As a result of such a constitution, the above problem is solved. However, in the audio output system comprising the speaker driving device shown in FIG. 6, the constitution is such that selective switching is controlled to select an amplifier circuit with an amplification gain corresponding with the connected load among the two types of amplifier circuit in the speaker driving device 600 by applying a control signal from the outside in accordance with the type of the load connected to the output terminal 603 of the speaker driving device 600 as mentioned earlier and, therefore, the audio output system must comprise a special control terminal for selectively switching from the outside the two types of amplifier circuits in the speaker driving device 600 corresponding to a dynamic speaker connection and a piezoelectric speaker connection as the speaker load. When the speaker driving device is made into an IC chip as a semiconductor integrated circuit, the total number of terminals must be a number of terminals that takes into consideration control-terminal expansion such as a driving load switching terminal, which creates a new problem that the size of the IC chip must be increased.

SUMMARY OF THE INVENTION

The present invention solves the above conventional problem and an object of the present invention is to provide a speaker driving device and audio output system which, even when the speaker driving device is made to take the form of an IC chip constituting a semiconductor integrated circuit in a constitution where the dynamic speaker and piezoelectric speaker, which have different load impedances, can both be driven, make it possible to adapt to the respective driving of the dynamic speaker and piezoelectric speaker without increasing the chip size by suppressing the number of terminals and which make it possible to output a signal with the same power for the same input signal in the respective driving of the dynamic speaker and piezoelectric speaker.

In order to solve the above problem, the speaker driving amplifier circuit of the first invention is a speaker driving device capable of driving speakers of a plurality of types with different load impedances, comprising: a power supply voltage detection circuit that detects the voltage of a power supply that is applied between a power supply terminal and ground corresponding to the load impedance of the connected speaker; an amplifier circuit which amplifies an input signal to drive the speaker with the power supply as a source of power; and a gain switching circuit that switches the amplification gain of the amplifier circuit so that the same output power is produced for the same input signal in each of the drivable speakers of the plurality of types in accordance with the detection result of the power supply voltage detection circuit, wherein the amplifier circuit amplifies the input signal by the gain switched by the gain switching circuit.

Further, the audio output system of the second invention comprises: a speaker having a specific load impedance; a power supply voltage detection circuit that detects the voltage of a power supply that is applied between a power supply terminal and ground corresponding to the load impedance of the connected speaker; an amplifier circuit which amplifies an input signal to drive the speaker with the power supply as a source of power; and a gain switching circuit that switches the amplification gain of the amplifier circuit so that the same output power is produced for the same input signal as when driving a speaker with another load impedance in accordance with the detection result of the power supply voltage detection circuit, wherein the amplifier circuit amplifies the input signal by the gain switched by the gain switching circuit.

As described above, the gain of the amplifier circuit is switched by the gain switching circuit so that the same output power is produced for the same input signal in the respective driving of speakers with different load impedances in accordance with the supply-voltage detection result of the power supply voltage detection circuit, and the input signal is amplified by means of this gain in order to be able to drive the speaker.

Further, the speaker driving device of the third invention is a speaker driving device capable of driving speakers of a plurality of types with different load impedances, comprising: a power supply terminal and driver power supply terminal to which power supplies with different voltages are applied corresponding to the load impedance of the connected speaker; a power supply voltage detection circuit that detects whether the power supply terminal and the driver power supply terminal are shorted corresponding to the load impedance of the speaker on the basis of the supply voltage of the power supply terminal and the supply voltage of the driver power supply terminal; an amplifier circuit which amplifies an input signal to drive the speaker with the power supply of the power supply terminal and the driver power supply terminal as a source of power; and a gain switching circuit that switches the amplification gain of the amplifier circuit so that the same output power is produced for the same input signal in each of the drivable speakers of the plurality of types in accordance with the detection result of the power supply voltage detection circuit, wherein the amplifier circuit amplifies the input signal by the gain switched by the gain switching circuit.

In addition, the audio output system of the fourth invention comprises: a speaker having a specific load impedance; a power supply terminal and driver power supply terminal to which power supplies with different voltages are applied corresponding to the load impedance of the connected speaker; a power supply voltage detection circuit that detects whether the power supply terminal and the driver power supply terminal are shorted corresponding to the load impedance of the speaker on the basis of the supply voltage of the power supply terminal and the supply voltage of the driver power supply terminal; an amplifier circuit which amplifies an input signal to drive the speaker with the power supply of the power supply terminal and the driver power supply terminal as a source of power; and a gain switching circuit that switches the amplification gain of the amplifier circuit so that the same output power is produced for the same input signal as when driving a speaker with another load impedance in accordance with the detection result of the power supply voltage detection circuit, wherein the amplifier circuit amplifies the input signal by the gain switched by the gain switching circuit.

As detailed above, the gain of the amplifier circuit is switched by the gain switching circuit so that the same output power is produced for the same input signal in the respective driving of speakers with different load impedances in accordance with the detection result of the short state of the power supply terminal and driver power supply terminal detected by the power supply voltage detection circuit, and the input signal is amplified by means of this gain in order to be able to drive the speaker.

As described above, even when the speaker driving device is made to take the form of an IC chip constituting a semiconductor integrated circuit in a constitution where the dynamic speaker and piezoelectric speaker, which have different load impedances, can both be driven, the speaker driving device is able to adapt to the respective driving of speakers of a plurality of types without increasing the chip size by suppressing the number of terminals and is capable of outputting a signal with the same power for the same input signal in the respective driving of the dynamic speaker and piezoelectric speaker.

DESCRIPTION OF THE PREFERRED EMBODIMENTS

The speaker driving device and audio output system of embodiments of the present invention will be described specifically hereinbelow with reference to the drawings.

First Embodiment

The speaker driving device and audio output system of a first embodiment of the present invention will now be described.

Figure 1:
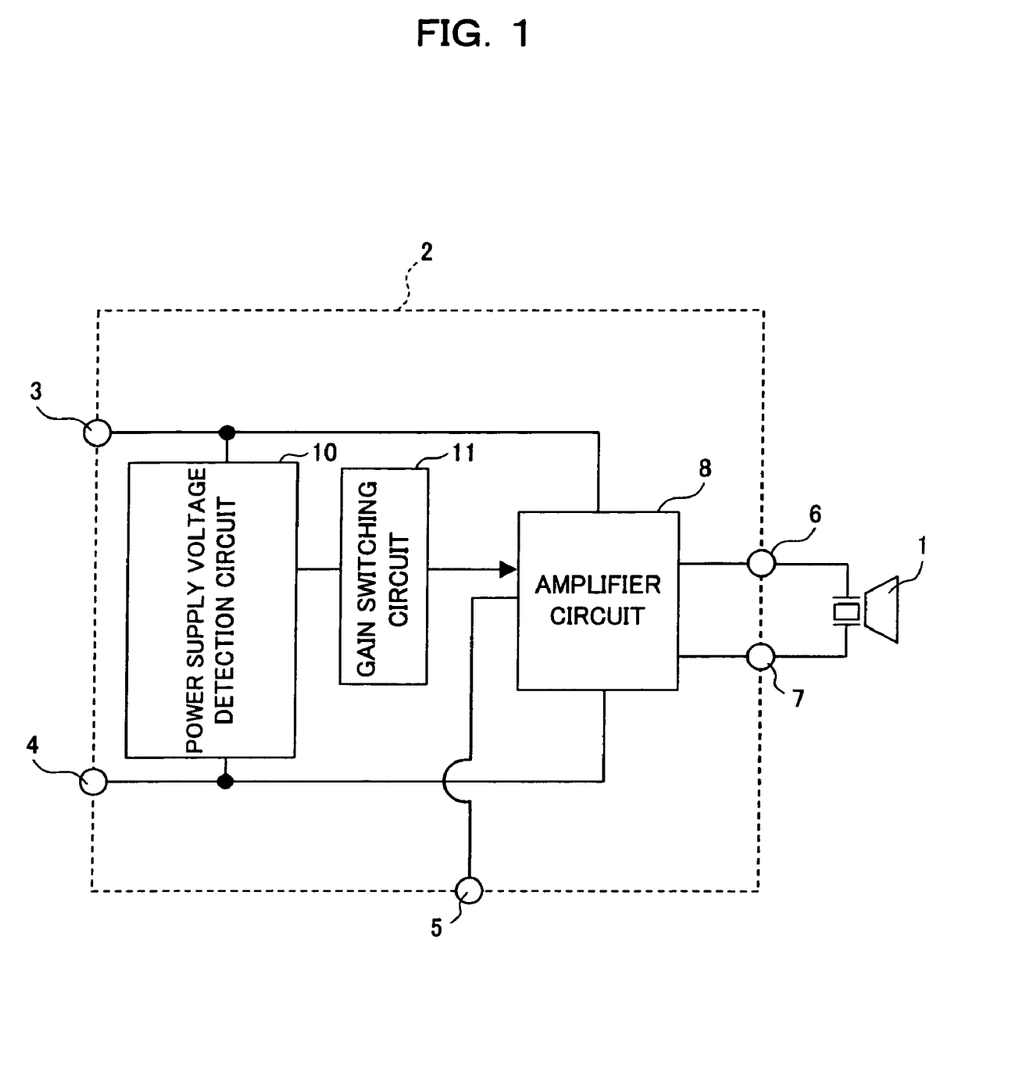
FIG. 1 is a block diagram showing a constitutional example of a speaker driving device and audio output system of a first embodiment of the present invention.

FIG. 1 is a block diagram showing a constitutional example of the speaker driving device and audio output system of the first embodiment of the present invention. In the speaker driving device 2 of the audio output system shown in FIG. 1, the amplifier circuit 8 is a circuit that amplifies a signal that is inputted from the input terminal 5 and drives a speaker 1 by means of output terminals 6 and 7, wherein a power supply voltage detection circuit 10, which detects the voltage of a power supply terminal 3 and determines whether the speaker connected to the output terminals 6 and 7 is a dynamic speaker or a piezoelectric speaker by means of the voltage, is connected between the power supply terminal 3 and ground terminal 4, and a gain switching circuit 11, which switches the voltage gain of the amplifier circuit 8 by means of the output of the power supply voltage detection circuit 10 is provided between the power supply voltage detection circuit 10 and amplifier circuit 8.

Figure 3:
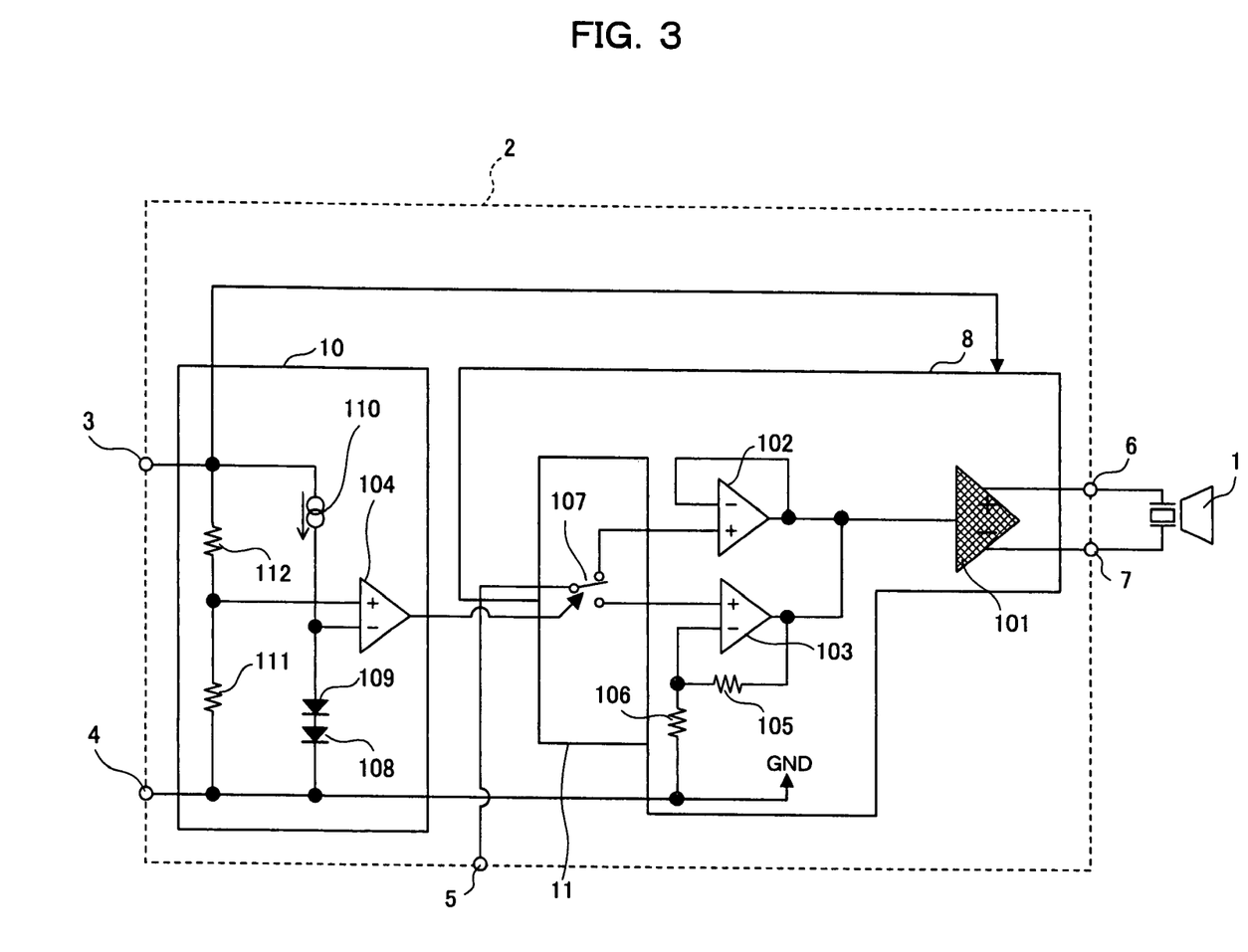
FIG. 3 is a circuit diagram showing a specific constitutional example of the speaker driving device and audio output system of the first embodiment of the present invention.

FIG. 3 is a circuit diagram showing a specific constitutional example of the speaker driving device and audio output system of the first embodiment of the present invention. In the case of a speaker driving device 2 of the audio output system shown in FIG. 3, the power supply voltage detection circuit 10 is constituted by a comparator 104 that compares the set voltage bias of diodes 108 and 109 that is emitted as a result of flowing through a fixed current source 110 and the voltage of the power supply terminal 3 with the resistance division voltage of the resistors 111 and 112 and outputs the comparison results. Further, the gain switching circuit 11 switches between a non-inverting amplifier circuit 102 with a voltage gain of 0 dB in the amplifier circuit 8 and a non-inverting amplifier 103 of a certain voltage gain by means of a switch 107. The constitution is such that non-inverting amplifier circuit 102 operates when the dynamic speaker is used and the non-inverting amplifier 103 operates when the piezoelectric speaker is used, whereby the voltage gain of the amplifier circuit 8 is switched.

Normally, when a 3V voltage supply voltage is used when the dynamic speaker is employed as the speaker and a piezoelectric speaker with a higher load impedance than the dynamic speaker is used, a supply voltage of approximately 7V is used in order to gain the dynamic range. Therefore, when voltage detection is established at a supply voltage of 5V or more, the resistance value of resistor 111 and the resistance value of resistor 112 can be implemented at 7:18.

When the piezoelectric speaker, which employs a supply voltage of approximately 7V, is used, the output of the comparator 104 is ON (HIGH), the non-inverting amplifier 103 operates, and the voltage again of the whole of the speaker driving device 2 is increased by the voltage gain of the non-inverting amplifier 103.

Further, by establishing conditions that satisfy vol*vol/RL1=vo2*vo2/RL2, Gv1=20log(vol/vi), Gv2=20log(vo2/vi) for an input that applies to the dynamic range, the same output power can be outputted for the same input. Therefore, vo1 is the output voltage when using the dynamic speaker, vo2 is the output voltage when using the piezoelectric speaker, RL1 is the impedance of the dynamic speaker, RL2 is the impedance of the piezoelectric speaker, Gv1 is the voltage gain when using the dynamic speaker, Gv2 is the voltage gain when using the piezoelectric speaker, and vi is the input voltage.

As mentioned earlier, it is detected whether the supply voltage applied to the power supply terminal 3 is used for the dynamic speaker or for the piezoelectric speaker by the power supply voltage detection circuit 10 and, in accordance with the detection result, the gain of the amplifier circuit 8 is switched by a gain switching circuit 11 so that the same output power is produced for the same input signal in the respective speaker driving, whereby it is possible to drive speaker 1, which is connected to the output terminals 6 and 7, by amplifying the input signal from the input terminal 5 by the amplifier circuit 8 having the switched gain.

As a result, even when the speaker driving device takes the form of an IC constituting a semiconductor integrated circuit in a constitution where both the dynamic speaker and the piezoelectric speaker with different load impedances can be driven, the speaker driving device can adapt to the respective driving of the dynamic speaker and piezoelectric speaker without there being an increase in the chip size by suppressing the number of terminals, whereby a signal of the same power can be outputted for the same input signal in the respective speaker driving.

Second Embodiment

The speaker driving device and audio output system of a second embodiment will now be described.

Figure 2:
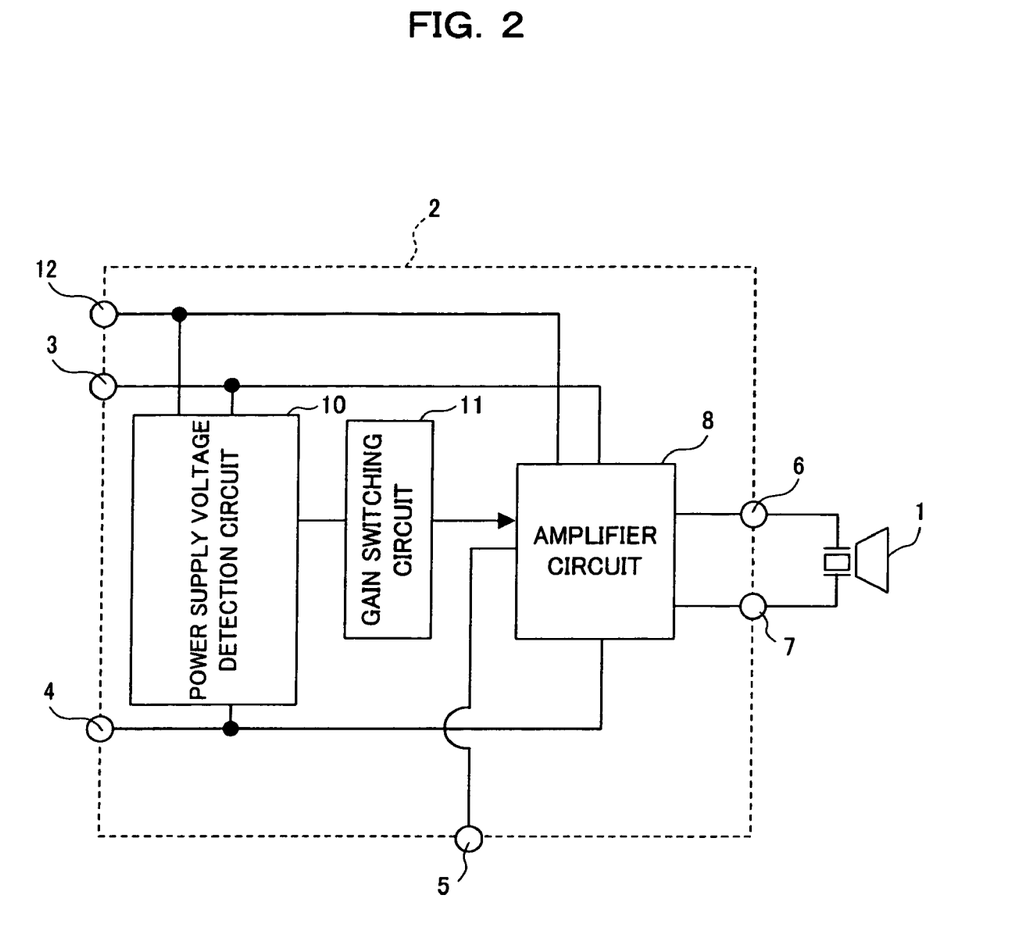
FIG. 2 is a block diagram showing a constitutional example of a speaker driving device and audio output system of a second embodiment of the present invention.

FIG. 2 is a block diagram showing a constitutional example of the speaker driving device and audio output system of the second embodiment of the present invention. In the speaker driving device 2 of the audio output system shown in FIG. 2, the amplifier circuit 8 is a circuit that amplifies a signal that is inputted from the input terminal 5 and drives a speaker 1 by means of output terminals 6 and 7, wherein the power supply terminal 3 is a power supply terminal for the output transistor of the amplifier circuit 8, and a driver power supply terminal 12 is a power supply terminal other than the output transistor in the amplifier circuit 8 and is a terminal for supplying a voltage that is higher than that of the power supply terminal 3, of approximately 7V, for example. The speaker driving device comprises the drive power supply terminal 12 in order to suppress the power consumption when using the dynamic speaker and for RAIL TO RAIL operation. Further, because the load impedance is high at 3V of the power supply terminal 3 when the piezoelectric speaker is used, the voltage of the power supply terminal 3 is used at approximately 7 v.

The power supply voltage detection circuit 10, which determines whether the speaker 1 connected to the output terminals 6 and 7 is a dynamic speaker or a piezoelectric speaker by means of the voltage of the driver power supply terminal 12 and the voltage of the voltage terminal 3, is connected to the driver power supply terminal 12, power supply terminal 3, and GND terminal 4, and a gain switching circuit 11, which switches the voltage gain of the amplifier circuit 8 by means of the output of the power supply voltage detection circuit 10, is provided between the power supply voltage detection circuit 10 and output amplifier circuit 8.

Figure 4:
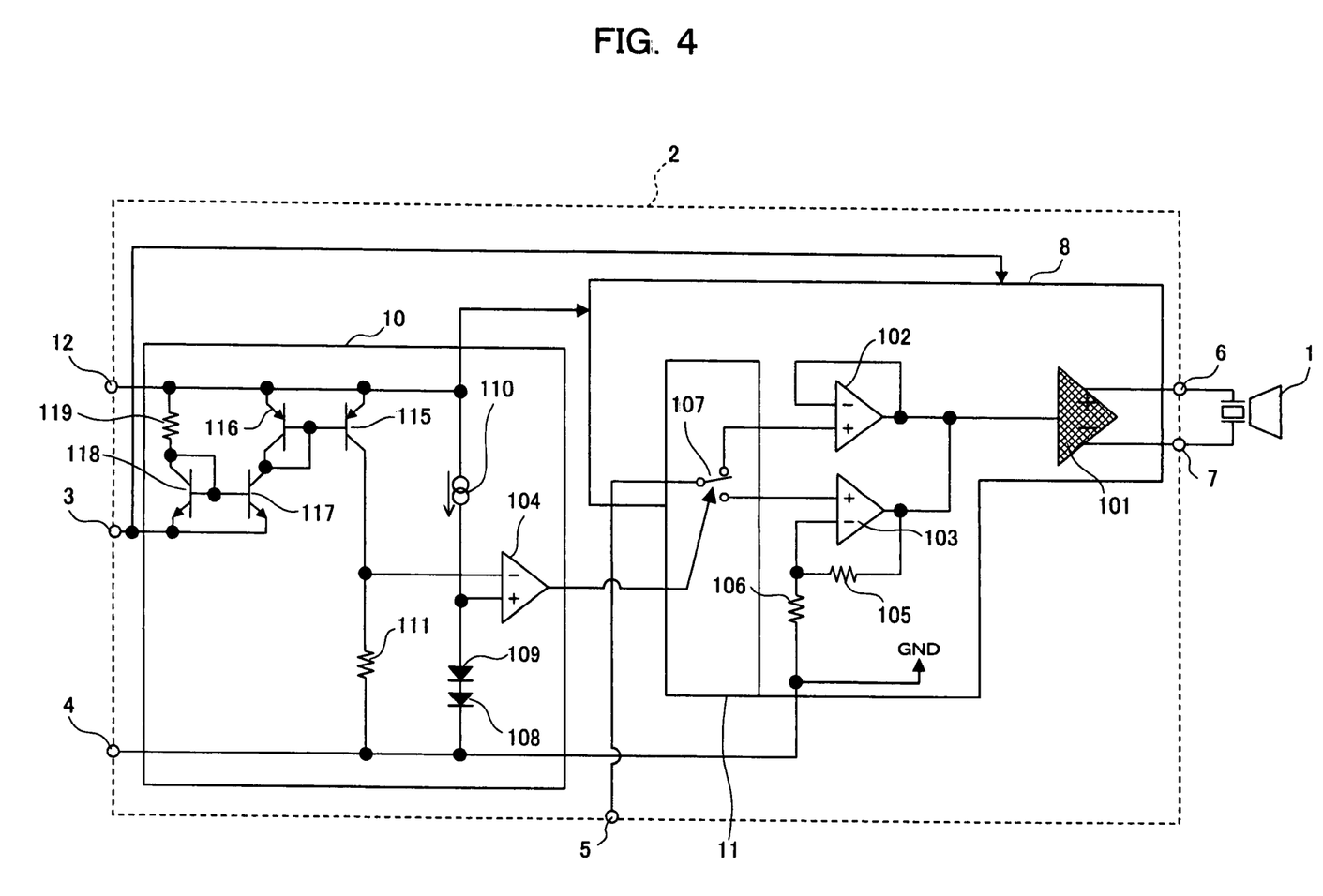
FIG. 4 is a circuit diagram showing a specific constitutional example of the speaker driving device and audio output system of the second embodiment of the present invention.

FIG. 4 is a circuit diagram showing a specific constitutional example of the speaker driving device and audio output system of the second embodiment. In the speaker driving device 2 of the audio output system shown in FIG. 4, when the fixed voltage bias of the diodes 108 and 109 and the voltage of the power supply terminal 3 have dropped −0.7V or less below the voltage of the driver power supply terminal 12 as a result of the current of a fixed current source 110 flowing, the power supply voltage detection circuit 10 mirrors the current produced in the resistor 119 and transistor 118 by means of the transistor 118 and transistor 117, and compares, by means of a comparator 104, the voltage that induces a current in the resistor 111 in a current mirror circuit of the transistors 116 and 115, judges that the dynamic speaker is being used, and sets the output of the comparator 104 to OFF (to the LOW level). For example, when 3V are applied to the power supply terminal 3 and 7V are applied to the driver power supply terminal 12, a connection with the dynamic speaker is discerned.

On the other hand, because a current is not produced in the resistor 119 or transistors 118, 117, 116, and 115 when the power supply terminal 3 and driver power supply terminal 12 are shorted for use in the same 7V application, the output of the comparator 104 is then ON (HIGH level) and a connection with the piezoelectric speaker is discerned.

The gain switching circuit 11 receives the output signal of the comparator 104 and switches between the non-inverting amplifier circuit 102 with a voltage gain of 0 dB and the non-inverting amplifier 103 with a certain voltage gain by means of the switch 107. That is, the non-inverting amplifier circuit 102 operates when the dynamic speaker is used and the non-inverting amplifier 103 operates when the piezoelectric speaker is used, whereby the voltage gain of the amplifier circuit 8 is switched.

Further, by establishing conditions that satisfy vo1*vo1/RL1=vo2*vo2/RL2, Gv1=20log(vo1/vi), Gv2=20log(vo2/vi) for an input that applies to the dynamic range, the same output power can be outputted for the same input. Therefore, vo1 is the output voltage when using the dynamic speaker, vo2 is the output voltage when using the piezoelectric speaker, RL1 is the impedance of the dynamic speaker, RL2 is the impedance of the piezoelectric speaker, Gv1 is the voltage gain when using the dynamic speaker, Gv2 is the voltage gain when using the piezoelectric speaker, and vi is the input voltage.

As mentioned earlier, it is detected by the power supply voltage detection circuit 10 whether the power supply terminal 3 and driver power supply terminal 12 are shorted on the basis of each of the supply voltages applied to the power supply terminal 3 and driver power supply terminal 12, it is judged whether the speaker connected to the output terminals 6 and 7 is a dynamic speaker or piezoelectric speaker, the gain of the amplifier circuit 8 is switched in accordance with the result by the gain switching circuit 11 so that the same output power is produced for the same input signal in the respective speaker driving, and the input signal from the input terminal 5 is amplified by the amplifier circuit 8 with the gain in order to be able to drive speaker 1, which is connected to the output terminals 6 and 7.

As a result, even when the speaker driving device takes the form of an IC constituting a semiconductor integrated circuit in a constitution where both the dynamic speaker and the piezoelectric speaker with different load impedances can be driven, the speaker driving device can adapt to the respective driving of the dynamic speaker and piezoelectric speaker without there being an increase in the chip size by suppressing the number of terminals, whereby a signal of the same power can be outputted for the same input signal in the respective speaker driving.

What is claimed is:

1. A speaker driving device for driving speakers of a plurality of types with different load impedances, comprising:
   an output terminal to which a speaker among a plurality of types selected is connected;
   a power supply terminal to which a voltage corresponding to a load impedance of a speaker connected to the output terminal is applied;
   a power supply voltage detection circuit for determining a type of speaker connected to the output terminal based on a voltage applied to the power supply terminal;
   an amplifier circuit for amplifying an input signal to drive a speaker connected to the output terminal with a voltage applied to the power supply terminal as a source of power; and
   a gain switching circuit for switching a gain of the amplifier circuit to a gain corresponding to a type of speaker connected to the output terminal as determined by the power supply voltage detection circuit so that when the same input signal is applied to any one of the plurality of types of speakers, the same output power of the amplifier circuit is produced, wherein the amplifier circuit amplifies the input signal by a gain switched by the gain switching circuit.

2. An audio output system comprising:
   a speaker driving device according to claim 1; and
   a speaker having a specific load impedance connected to an output terminal of the speaker driving device.

3. A speaker driving device for driving speakers of a plurality of types with different load impedances, comprising:
   an output terminal to which a speaker among a plurality of types selected is connected;
   a power supply terminal and driver power supply terminal to which different voltages corresponding to a load impedance of a speaker connected to the output terminal are applied;
   a power supply voltage detection circuit for determining a type of speaker connected to the output terminal by detecting whether the power supply terminal and the driver power supply terminal are shorted based on a voltage applied to each of the power supply terminal and the driver power supply terminal;

an amplifier circuit for amplifying an input signal to drive a speaker connected to the output terminal with a voltage applied to each of the power supply terminal and the driver power supply terminal as a source of power; and a gain switching circuit for switching a gain of the amplifier circuit to a gain corresponding to a type of speaker connected to the output terminal determined by the power supply voltage detection circuit so that when the same input signal is applied to any one of the plurality of types of speakers, the same output power of the amplifier circuit is produced, wherein the amplifier circuit is also for amplifying the input signal by a gain switched by the gain switching circuit.

4. An audio output system comprising:

a speaker driving device according to claim 3; and a speaker having a specific load impedance connected to an output terminal of the speaker driving device.

* * * * *